United States Patent
Kim (10) Patent No.: US 9,626,534 B2
(45) Date of Patent: Apr. 18, 2017

(54) SIM CARD CONNECTOR AND ELECTRONIC DEVICE INCLUDING THE SAME

(71) Applicant: Samsung Electronics Co., Ltd., Gyeonggi-do (KR)

(72) Inventor: Piljun Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 76 days.

(21) Appl. No.: 14/574,856

(22) Filed: Dec. 18, 2014

(65) Prior Publication Data
US 2015/0200482 A1 Jul. 16, 2015

(30) Foreign Application Priority Data

Jan. 10, 2014 (KR) .......................... 10-2014-0003259

(51) Int. Cl.
| | |
|---|---|
| G06K 7/00 | (2006.01) |
| H01R 12/57 | (2011.01) |
| H05K 5/02 | (2006.01) |
| H01R 13/24 | (2006.01) |
| H01R 12/71 | (2011.01) |
| H05K 7/14 | (2006.01) |
| H01R 4/48 | (2006.01) |

(52) U.S. Cl.
CPC .......... *G06K 7/0021* (2013.01); *H01R 4/4809* (2013.01); *H01R 12/57* (2013.01); *H01R 12/716* (2013.01); *H01R 13/24* (2013.01); *H05K 5/0269* (2013.01); *H05K 5/0291* (2013.01); *H05K 7/1418* (2013.01)

(58) Field of Classification Search
CPC .. H05K 5/0269; H05K 5/0291; H05K 7/1418; H01R 13/24; H01R 4/4809; H01R 12/716; H01R 12/57; G06K 7/0021
USPC .......................................... 439/65, 630, 946
See application file for complete search history.

(56) References Cited

U.S. PATENT DOCUMENTS 8,608,511 B2 * 12/2013 Zhang ................. G06K 7/0021
439/630
2013/0102170 A1 4/2013 Yang et al.

FOREIGN PATENT DOCUMENTS

KR 10-2013-0043753 A 5/2013

* cited by examiner

*Primary Examiner* — Abdullah Riyami
*Assistant Examiner* — Justin Kratt
(74) *Attorney, Agent, or Firm* — Cha & Reiter, LLC (57) ABSTRACT

An electronic device and a Subscriber Identity Module Card (SIM card) connector mounted in the same are disclosed. The SIM card connector includes a lower surface support having an open area adapted to receive a SIM card and a contact area adapted to be electrically coupled to the SIM card, an elastic support disposed near at least one side surface of the open area, the elastic support having a predetermined width and an elasticity expressed towards an upper surface support of the SIM card connector and having a shape surrounding the contact area, a side surface support having a predetermined height disposed circumferentially at distal edges of the lower surface support except for the open area, and the upper surface support coupled to the side surface support and having a top surface formed parallel to the lower surface support adapted to partially enclose an upper portion of the SIM card.

20 Claims, 7 Drawing Sheets

SIM CARD CONNECTOR AND ELECTRONIC DEVICE INCLUDING THE SAME

CROSS REFERENCE TO RELATED APPLICATION

This application claims the benefit under 35 U.S.C. §119(a) of a Korean patent application filed on Jan. 10, 2014 in the Korean Intellectual Property Office and assigned Serial No. 10-2014-0003259, the entire disclosure of which is hereby incorporated by reference.

TECHNICAL FIELD

The present disclosure relates to a connector that enables a Subscriber Identity Module Card (SIM card) to mount in an electronic device.

BACKGROUND

Communication methods of a portable wireless communication terminal include a Global System for Mobile (GSM) communication method (commonly utilized in Europe) and a Code Division Multiple Access (CDMA) method. In order to guarantee compatibility between various network service subscribers, the GSM method uses a SIM card mounted within portable wireless terminals. The SIM card encodes and stores information utilized for operating the portable wireless terminal, such as a phone numbers, a network number and personal information of a subscriber such as a password. Accordingly, the portable wireless terminal provides a SIM card connector in a main Printed Circuit Board (PCB) housed in a main body and is designed so that the SIM card is electrically connected to the SIM card connector.

Figure 1:
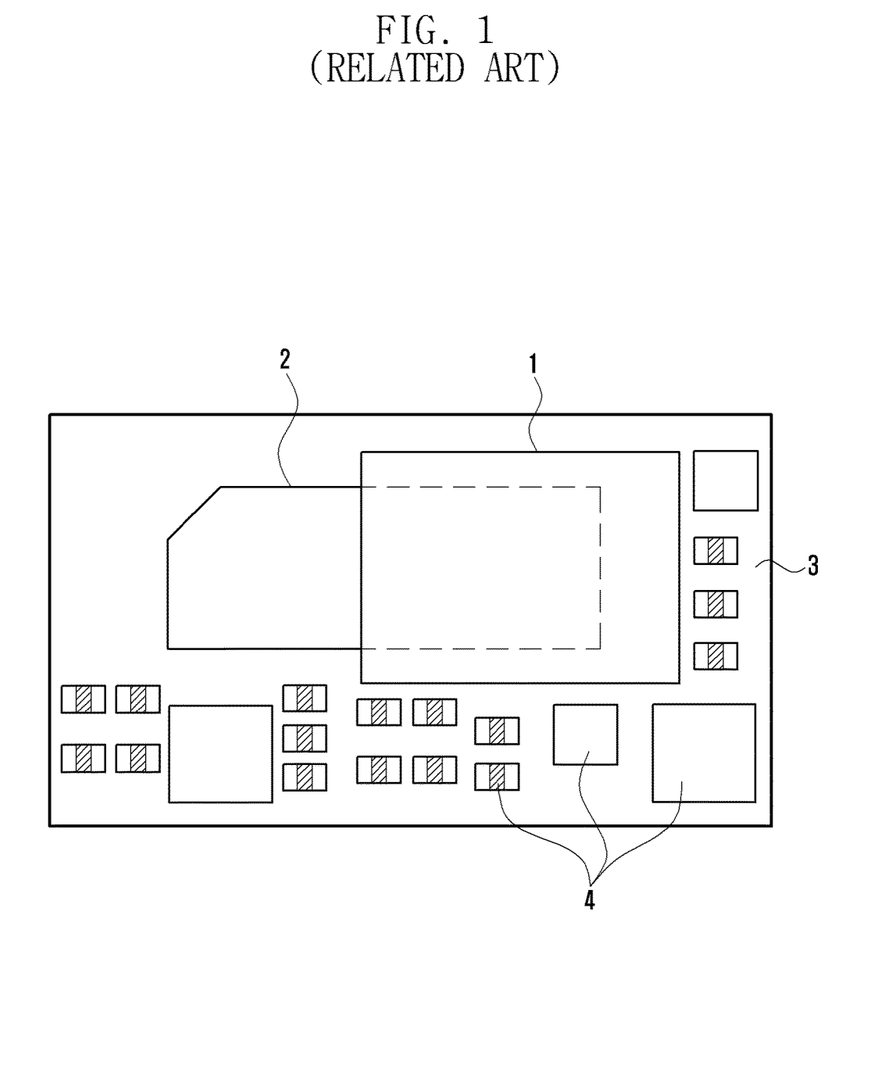
FIG. 1 is a top plan view illustrating a SIM card connector mounted in a PCB.

FIG. 1 illustrates a SIM card connector 1 mounted in an upper surface of a main PCB 3 of a portable wireless terminal. At an upper surface of the main PCB 3, a plurality of electronic component elements 4 are mounted, and a bottom surface of the SIM card connector 1 close contacts with the main PCB 3 to be securely fixed by soldering. A contact point (not shown) for electrical connection to the SIM card exists within the SIM card connector 1, and the contact point is connected through the main PCB to be electrically connected to a controller of the portable wireless terminal. In this state, as a user mounts a SIM card 2 in the SIM card connector 1 and detaches the SIM card 2 from the SIM card connector 1, the SIM card 2 may be electrically connected to the SIM card connector 1 and be electrically separated from the SIM card connector 1. In this way, the SIM card connector 1 uses a predetermined area of the main PCB as a mounting space.

Figure 2:
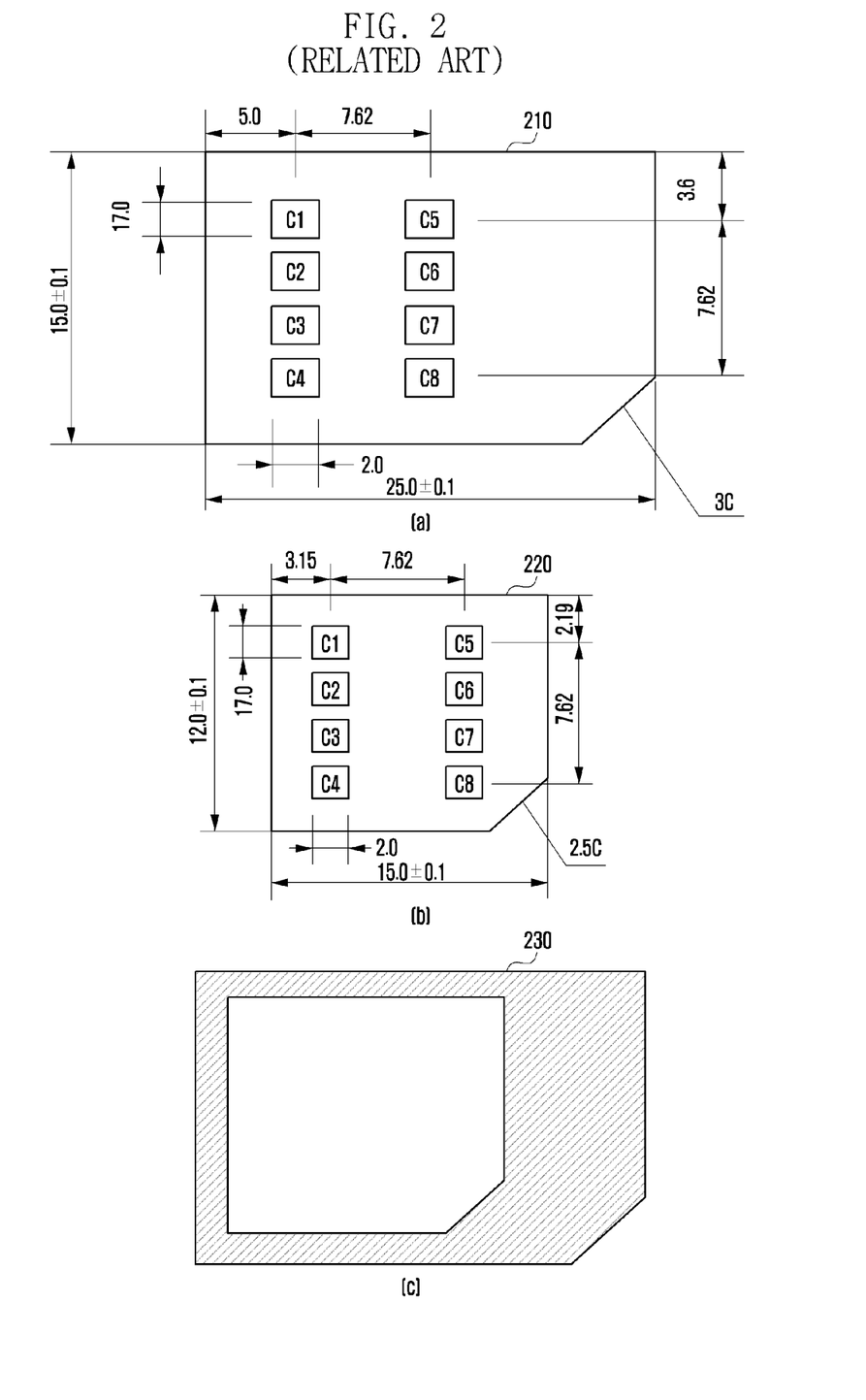
FIG. 2 is a top plan view illustrating a SIM card and a dummy adaptor of various particular specification sizes.

In order to more effectively use an area of the main PCB, a size of the SIM card may be reduced. FIG. 2A is a diagram illustrating a specification size of a mini SIM card 210, and FIG. 2B is a diagram illustrating a specification size of a micro SIM card 220. As shown in FIGS. 2A and 2B, the micro SIM card 220 has a size smaller than that of the mini SIM card 210, but specifications of contact points c1-c8 to electrically connect to the SIM card connector are the same. The SIM card may be classified into sizes such as a normal SIM card, nano SIM card, and a SIM card built-in to a terminal according to a specification size. SIM card have gradually been reducing down to ever smaller size for use in entire electronic devices.

Main circuit boards of electronic devices (such as a portable wireless terminals) generally possess a mounted SIM card connector of a predetermined size, and this may allow mounting of a SIM card of different size within the mounted SIM card connector. For example, a connector to mount the micro SIM card 220 is mounted on the main PCB, and when mounting the mini SIM card 210, a user may cut the mini SIM card 210 to resize it into a micro SIM card size. In contrast, a connector to mount the mini SIM card 210 is mounted on a main circuit board, and when mounting the micro SIM card 220, a user should insert and use a dummy adaptor 230 of FIG. 2C into the micro SIM card 220. A size of the dummy adaptor 230 is determined according to a size difference between the mini SIM card 210 and the micro SIM card 220.

In this way, because a conventional SIM card connector is mounted on a main PCB with a particular predetermined specification size, utilizing a SIM card of a size other than the predetermined specification size requires a user to additionally modify the SIM card, such as by cutting of portions of the SIM card to reduce their size, or the additional attachment of a dummy adaptor.

SUMMARY

The present disclosure has been made in view of the above problems, and provides a SIM card connector.

In one aspect of this disclosure, an electronic device and a Sub Subscriber Identity Module Card (SIM card) connector mounted in the same are disclosed. The electronic device includes a Printed Circuit Board (PCB), and the SIM card connector mounted in the PCB. The SIM card connector includes a lower surface support having an opening area adapted to receive a SIM card and a contact area adapted to be electrically coupled to the SIM card and, an elastic support disposed near at least one side surface of the opening including one end coupled to the opening, the elastic support having a predetermined width and an elastic force expressed towards an upper surface support, a side surface support having a predetermined height disposed circumferentially at distal edges of the lower support except for the opening, and the upper surface support coupled to the side surface support and having a top surface formed parallel to the lower surface support adapted to partially enclose an upper portion of the SIM card.

In a second aspect of this disclosure, a SIM card connector is disclosed, which includes a lower, surface support having an opening area adapted to receive a SIM card and a contact area adapted to be electrically coupled to the SIM card and an elastic support disposed near at least one side surface of the opening including one end coupled to the opening, the elastic support having a predetermined width and an elastic force expressed towards an upper surface support, a side surface support having a predetermined height disposed circumferentially at distal edges of the lower surface support except for the opening, and the upper surface support coupled to the side surface support and having a top surface formed parallel to the lower surface support adapted to partially enclose an upper portion of the SIM card.

BRIEF DESCRIPTION OF THE DRAWINGS

The present disclosure will be more apparent from the following detailed description in conjunction with the accompanying drawings, in which.

DETAILED DESCRIPTION

Hereinafter, example embodiments of the present disclosure are described in detail with reference to the accompanying drawings. While the present disclosure may be embodied in many different forms, specific embodiments of the present disclosure are shown in drawings and are described herein in detail, with the understanding that the present disclosure is to be considered as an exemplification of the principles of the disclosure and is not intended to limit the disclosure to the specific embodiments illustrated. The same reference numbers are used throughout the drawings to refer to the same or like parts.

An expression "comprising" or "may comprise" used in the present disclosure indicates presence of a disclosed corresponding function, operation, or element and does not limit additional at least one function, operation, or element. Further, in the present disclosure, a term "comprise" or "have" indicates presence of a characteristic, numeral, operation, operation, element, component, or combination thereof described in a specification and does not exclude presence or addition of at least one other characteristic, numeral, operation, operation, element, component, or combination thereof.

In the present disclosure, an expression "or" includes any combination or the entire combination of together listed words. For example, "A or B" may include A, B, or A and B.

An expression of "first", "second", "primary", and "secondary" in the present disclosure may represent various elements of the present disclosure, but do not limit corresponding elements. For example, the expressions do not limit order and/or importance of corresponding elements. The expressions may be used for distinguishing one element from another element. For example, both a first user device and a second user device are user devices and represent different user devices. For example, a first element may be referred to as a second element without deviating from the scope of the present disclosure, and similarly, a second element may be referred to as a first element.

When it is described that an element is "connected" or "electrically connected" to another element, the element may be "directly connected" or "directly electrically connected" to the other element or may be "connected" or "electrically connected" to the other element through a third element. However, when it is described that an element is "directly connected" or "directly electrically connected" to another element, no element may exist between the element and the other element.

Terms used in the present disclosure are not to limit the present disclosure but to illustrate example embodiments. When using in a description of the present disclosure and the appended claims, a singular form includes a plurality of forms unless it is explicitly differently represented.

Unless differently defined, entire terms including a technical term and a scientific term used here have the same meaning as a meaning that may be generally understood by a person of common skill in the art. It should be analyzed that generally using terms defined in a dictionary have a meaning corresponding to that of a context of related technology and are not analyzed as an ideal or excessively formal meaning unless explicitly defined.

An electronic device according to the present disclosure may be a device that performs a communication function with a GSM method. For example, the electronic device may include at least one of a smart phone, tablet Personal Computer (PC), mobile phone, video phone, e-book reader, desktop PC, laptop PC, Netbook computer, Personal Digital Assistant (PDA), Portable Multimedia Player (PMP), MPEG3 (MP3) player, mobile medical equipment, camera, or wearable device (e.g., Head-Mounted-Device (HMD) such as electronic glasses), electronic clothing, electronic bracelet, electronic necklace, electronic accessory, electronic tattoo, or smart watch.

According to various example embodiments, the electronic device may be a smart home appliance performing a communication function with a GSM method. The smart home appliance, for example the electronic device may include at least one of a television, Digital Video Disk (DVD) player, audio device, refrigerator, air conditioner, vacuum cleaner, oven, microwave oven, washing machine, air cleaner, set-top box, television box (e.g., Samsung HomeSync™, AppleTV™, or Google TV™), game consoles, electronic dictionary, electronic key, camcorder, or electronic frame.

According to various example embodiments, the electronic device may include at least one of various medical equipment (e.g., a Magnetic Resonance Angiography (MRA) device, Magnetic Resonance Imaging (MRI) device, Computed Tomography (CT) device, scanning device, and ultrasonic wave device), a navigation device, Global Positioning System (GPS) receiver, an Event Data Recorder (EDR), a Flight Data Recorder (FDR), a vehicle infotainment device, an electronic equipment for ship (e.g., navigation device for ship and gyro compass), avionics, a security device, or an industrial or home robot.

According to various example embodiments, the electronic device may include at least one of a portion of furniture or building/construction, an electronic board, an electronic signature receiving device, a projector, or various measuring devices (e.g., water supply, electricity, gas, or electric wave measuring device) performing a communication function with a GSM method. An electronic device according to the present disclosure may be at least one combination of the foregoing various devices. Further, an electronic device according to the present disclosure is not limited to the foregoing devices.

Figure 3:
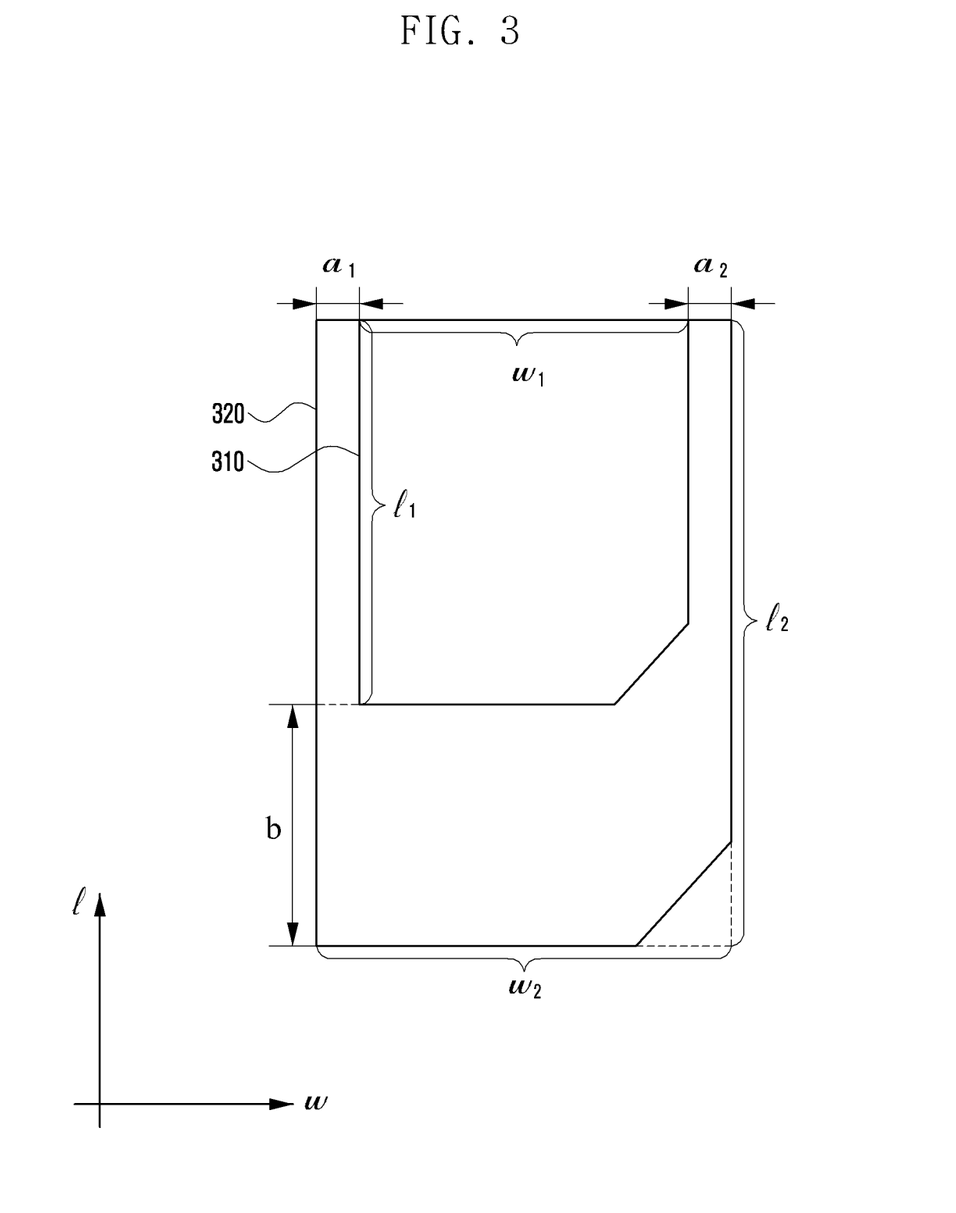
FIG. 3 is a top plan view illustrating a SIM card of different particular specification sizes according to an example embodiment of the present disclosure.

FIG. 3 is a top plan view illustrating a SIM card of different specification sizes according to an example embodiment of the present disclosure.

For example, a first SIM card 310 may be a micro SIM card, and a second SIM card 320 may be a mini SIM card. However, the first SIM card 310 and the second SIM card 320 are not limited thereto.

The first SIM card 310 may have a size smaller than that of the second SIM card 320. The first SIM card 310 may have a first predetermined width w1 and a first predetermined length 11. The second SIM card 320 may have a second predetermined width w2 and a second predetermined length 12. Widths of the first SIM card 310 and the second SIM card 320 may be different by the sum of a first width a1 and a second width a2. Lengths of the first SIM card 310 and the second SIM card 320 may be different by a first length b. Although not shown in FIG. 3, the first SIM card 310 and the second SIM card 320 may be formed in a predetermined equal thickness.

In order to be electrically connected to the SIM card connector, both the first SIM card 310 and the second SIM card 320 include a circuit including a plurality of contact points. The circuit may be formed at one surface of the SIM card, and a surface in which the circuit is formed is a low surface and a surface opposite thereto is an upper surface.

Figure 4A:
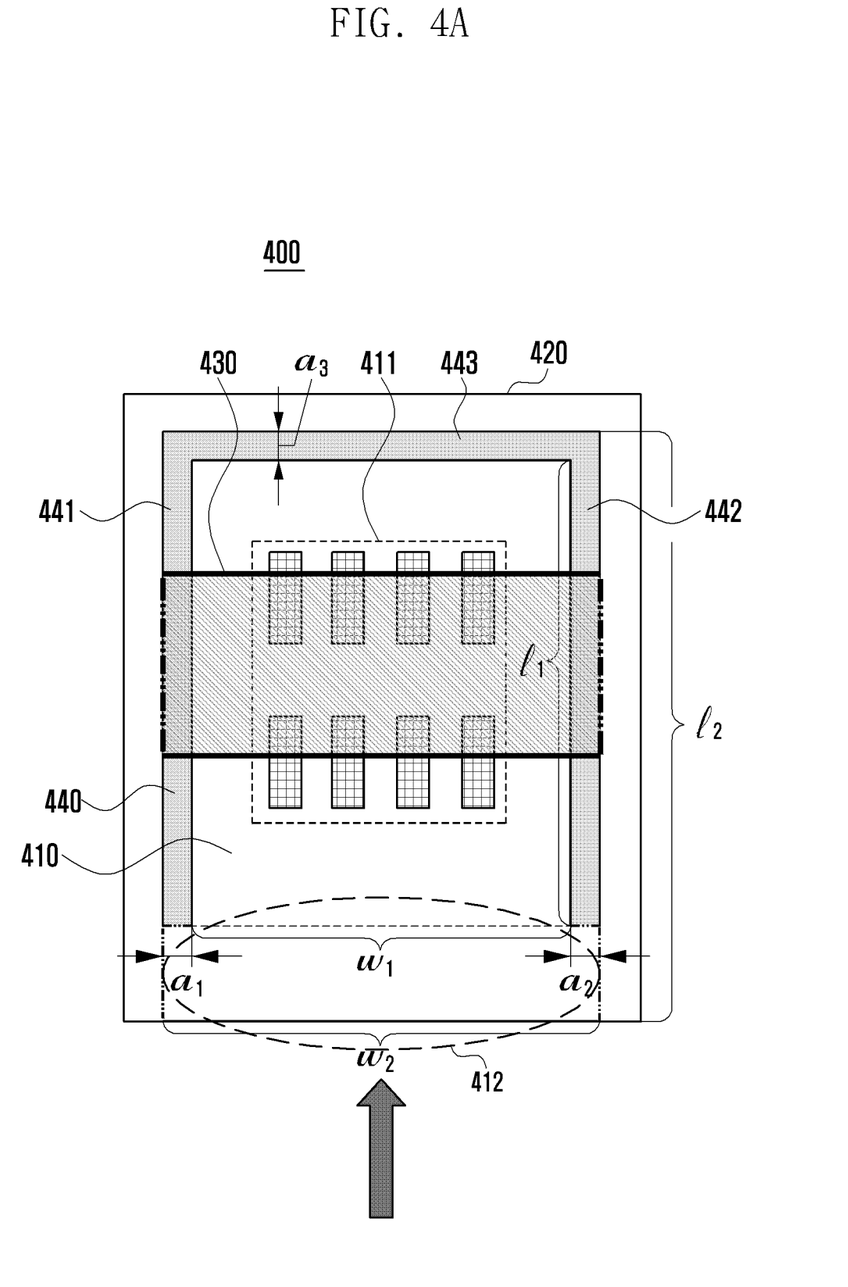
FIG. 4A is a top plan view illustrating a SIM card connector according to an example embodiment of the present disclosure.

FIG. 4A is a top plan view illustrating a SIM card connector 400 according to an example embodiment of the present disclosure.

The SIM card connector 400 may mount the first SIM card 310 and the second SIM card 320 having different sizes. Hereinafter, the first SIM card 310 and the second SIM card 320 are referred to as a SIM card, and when distinguishing respective SIM cards, the SIM card is distinguished as the first SIM card 310 or the second SIM card 320.

The SIM card connector 400 of FIG. 4 may include a lower surface support 410, a side surface support 420, an upper surface support 430, and an elastic support 440.

As the lower surface support 410 closely contacts with a Printed Circuit Board (PCB) of the electronic device, the SIM card connector 400 may be mounted on the electronic device. The lower surface support 410 may include a contact point 411 to electrically connect to the circuit of the SIM card. The contact point 411 may include a plurality of contact points, and the contact points may correspond with one-to-one to a plurality of contact points included in the circuit of the mounted SIM card.

The lower surface support 410 may include an open area (i.e. a slot or groove for insertion) 412 to insert the SIM card into the SIM card connector 400. The lower surface support 410 is enclosed by the side surface support 420, and in this case, an area that is not enclosed by the side surface support 420 and that is opened in a direction that inserts the SIM card may be the open area 412.

The elastic support 440 is extended with a predetermined width from at least one side surface of the open area 412 and may have an elastic force in a direction of the upper surface support 430. Therefore, in a state in which pressing is not performed, the elastic support 440 may form a predetermined angle to the lower surface support 410. The angle may be set in consideration of a height of the side surface support 420. When a pressing action is performed, the elastic support 440 moves in a direction of the lower surface support 410 and may form the same plane as the lower surface support 410. When pressing is not again performed, the elastic support 440 reforms its original angle in a direction of the upper surface support 430 by elastic force.

For example, the elastic support 440 may be formed by cutting a side surface, except for the open area 412 to have a predetermined width at the circumference of the lower surface support 410. Alternatively, the elastic support 440 may be formed with a method of connecting the respective distinguished elastic support 440 and lower surface support 410 in the same layer (i.e., as a single piece or portion). The elastic support 440 may be formed with a leaf spring according to one example embodiment. As shown in FIG. 4, the elastic support 440 may include a first second inclined portion 441 and a second inclined portion 442 and a connection portion 443 that connects the first second inclined portion 441 and the second inclined portion 442. In the first inclined portion 441, for example, one end thereof may be connected to the left side of the open area 412 to be extended with a first width a1. In the second inclined portion 442, one end thereof may be connected to the right side of the open area 412 to be extended with a second width a2. The sum of the first width a1 and the second width a2 may be approximately the same as the difference between widths of the first SIM card 310 and the second SIM card 320. The connection portion 443 may be extended with a third width a3 from the other end of the first inclined portion 441 to be connected to the other end of the second inclined portion 442. The third width a3 may be set in consideration of a length difference between the first SIM card 310 and the second SIM card 320 and a length of the open area 412. When the first SIM card 310 is completely inserted into the SIM card connector 400, a circuit formed in the first SIM card 310 may be set to correspond to the contact point 411 formed in the lower surface support 410.

The side surface support 420 may be formed to have a predetermined height at a side surface, except for the open area 412 of the outermost circumference of the lower surface support 410 and the elastic support 440. The side surface support 420 may be connected in a portion meeting with the outer circumference of the lower surface support 410. However, because a portion in which the side surface support 420 meets with the outer circumference of the elastic support 440 may vertically move according to an elastic force of the elastic support 440, the side surface support 420 and the elastic support 440 are not connected. A height of the side surface support 420 may be set in consideration of a thickness of the SIM card.

The upper surface support 430 is connected to the side surface support 420, and when inserting the SIM card, in order to cover an upper portion of the SIM card, the upper surface support 430 may be formed parallel to the lower surface support 410.

Figure 4B:
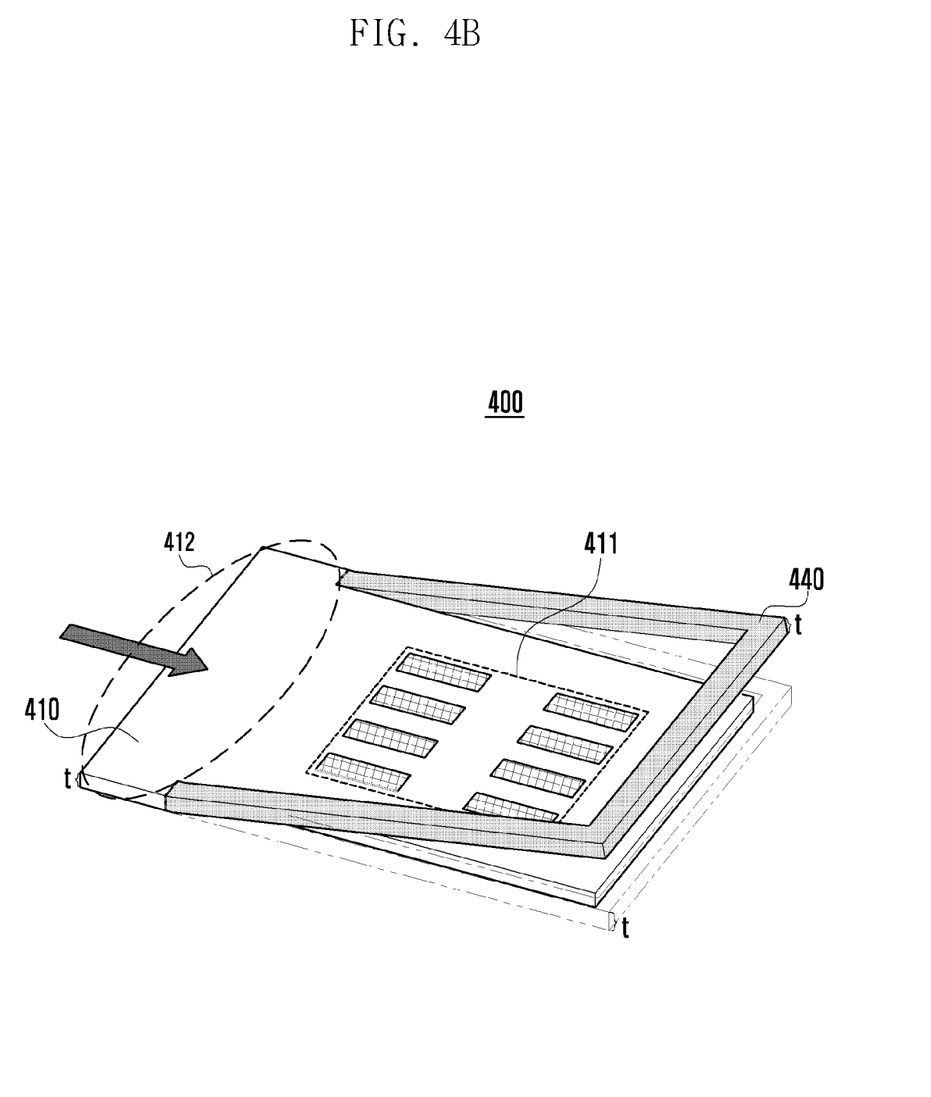
FIG. 4B is a side view illustrating the SIM card connector of FIG. 4A.

FIG. 4B is a side view illustrating the SIM card connector 400 according to an example embodiment of the present disclosure.

For a more detailed description, a configuration of the side surface support 420 and the upper surface support 430 is omitted.

The lower surface support 410 may have a predetermined thickness t. As described above, the elastic support 440 may be formed at the remaining circumference, except for the open area 412 of the lower surface support 410 and may be formed to have the same layer and the same thickness as those of the lower surface support 410. However, because the elastic support 440 has an elastic force in a direction of the upper surface support 430, when pressing is not performed, the elastic support 440 may form a predetermined angle to the lower surface support 410. For example, as the SIM card is inserted, when the elastic support 440 is pressed, the elastic support 440 and the lower surface support 410 may form the same plane. That is, upon pressing, a space in which the elastic support 440 is to be located may be formed between the lower. surface support 410 and the side surface support 420.

Figure 5A:
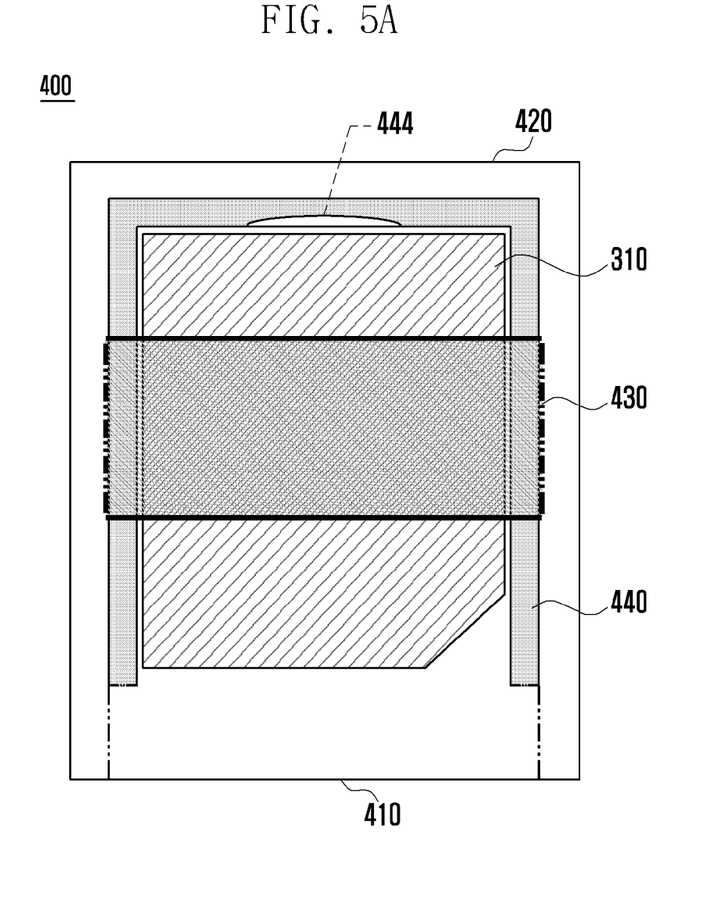
FIG. 5A is a top plan view illustrating a SIM card connector in which a micro SIM card is mounted according to an example embodiment of the present disclosure.
Figure 5B:
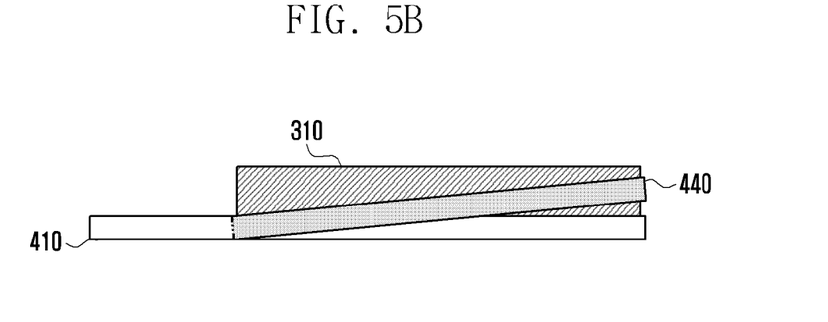
FIG. 5B is a side view illustrating the SIM card connector in which the micro SIM card of FIG. 5A is mounted.

FIGS. 5A and 5B are a top plan view and a side view, respectively, illustrating a SIM card connector 400 in which a first SIM card, for example a micro SIM card 310 is mounted according to an example embodiment of the present disclosure.

The micro SIM card 310 may be inserted into the SIM card connector 400 through an open area. The micro SIM card 310 may be inserted between an elastic support 440 advancing in a direction of an upper surface support 430 by an elastic force. A width of the elastic support 440 may be approximately the same as that of the micro SIM card 310. When the micro SIM card 310 is completely inserted into the SIM card connector 400, a circuit formed in the micro SIM card 310 and a contact point formed in a lower surface support 410 of the SIM card connector 400 may correspond to be electrically connected. When the micro SIM card 310 is completely inserted into the SIM card connector 400, as shown in FIGS. 5A and 5B, a low surface of the micro SIM card 310 may be supported by the lower surface support 410, a side surface may be supported by the elastic support 440, and an upper surface may be supported by the upper surface support 430. In FIG. 5B, a configuration of a side surface support 420 and the upper surface support 430 is omitted. For easy detachment of the inserted micro SIM card 310, a groove 444 may be formed in the elastic support 440, as shown in FIGS. 5A and 5B.

Figure 6A:
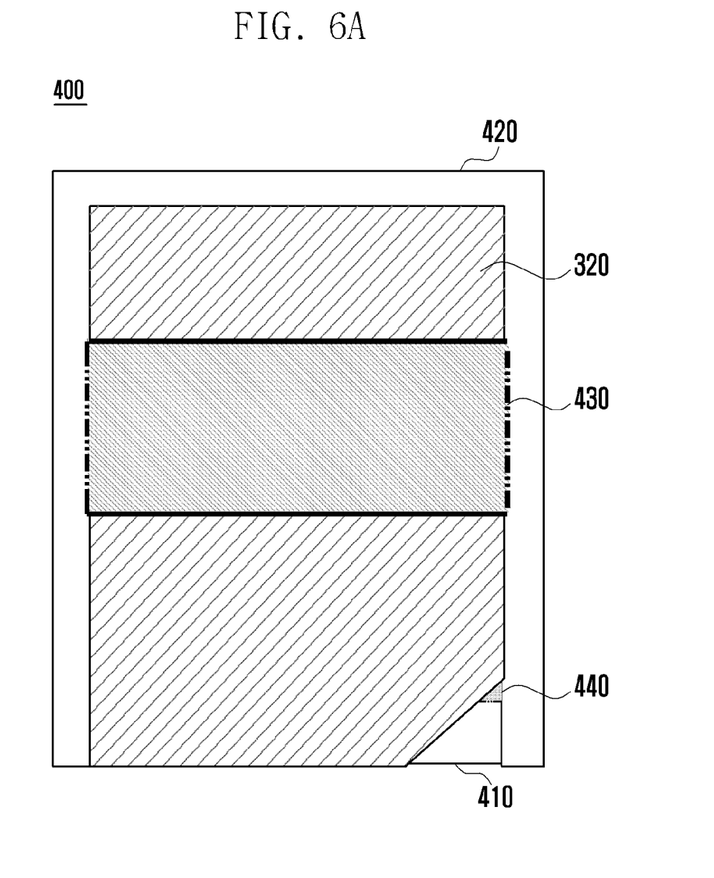
FIG. 6A is a top plan view illustrating a SIM card connector in which a mini SIM card is mounted according to an example embodiment of the present disclosure.
Figure 6B:
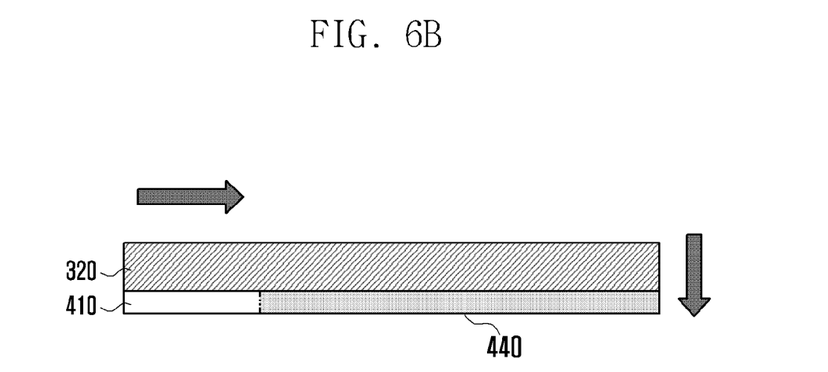
FIG. 6B is a side view illustrating the SIM card connector in which the mini SIM card of FIG. 6A is mounted.

FIGS. 6A and 6B are a top plan view and a side view, respectively, illustrating a SIM card connector in which a second SIM card, for example a mini SIM card is mounted according to an example embodiment of the present disclosure.

A mini SIM card 320 may be inserted into a SIM card connector 400 through an open area. A width of the mini SIM card 320 may be approximately the same as that of a side surface supports 420. That is, when the mini SIM card 320 is inserted, an elastic support 440 is pressed by the mini SIM card 320 to move in a direction of a lower surface support 410, and when the mini SIM card 320 is completely inserted, the elastic support 440 is located to form the same layer as the lower surface support 410 at a space between the lower surface support 410 and the side surface support 420. Therefore, a circuit formed in the mini SIM card 320 and a contact point formed at the lower surface support 410 of the SIM card connector 400 may physically contact and transmit and receive an electrical signal. When the mini SIM card 320 is completely inserted into the SIM card connector 400, as shown in FIGS. 6A and 6B, a low surface may be supported by the lower surface support 410 and the elastic support 440, a side surface may be supported by the side surface support 420, and an upper surface may be supported by an upper surface support 430. In FIG. 6B, a configuration of the side surface support 420 and the upper surface support 430 is omitted.

As described above, according to the present disclosure, even when a SIM card connector of a larger size is mounted on a main PCB, a SIM card of a smaller size can be mounted without using a dummy adaptor.

Further, according to the present disclosure, a SIM card of various sizes can be mounted in an electronic device using one SIM card connector without an additional user manipulation.

Although example embodiments of the present disclosure have been described in detail hereinabove, it should be clearly understood that many variations and modifications of the basic inventive concepts herein described, which may appear to those skilled in the art, will still fall within the ambit of the example embodiments of the present disclosure as defined in the appended claims.

What is claimed is:

1. A Subscriber Identity Module Card (SIM card) connector, comprising:
    a lower surface support having an open area adapted to receive a SIM card and a contact area adapted to be electrically coupled to the SIM card;
    an elastic support disposed near at least one side surface of the open area and formed along a circumference of the lower surface support except for the open area, the elastic support having a predetermined width and an elasticity expressed towards an upper surface support of the SIM card connector; and
    a side surface support having a predetermined height disposed circumferentially at distal edges of the lower surface support except for the open area,
    wherein the upper surface support is coupled to the side surface support and includes a top surface formed parallel to the lower surface support adapted to partially enclose an upper portion of the SIM card.

2. The SIM card connector of claim 1, wherein the lower surface support and the elastic support are formed as a single structure.

3. . The SIM card connector of claim 2, wherein the elastic support is cut such that at least one side surface of the open area is the predetermined width.

4. The SIM card connector of claim 1, wherein the elastic support comprises:
    a first inclined portion having one end coupled to and extending from the at least one side surface of the open area of the lower surface support and having the elasticity;
    a second inclined portion having a second end coupled to and extending from another side surface of the at least one side surface of the open area and having the elasticity; and
    a connection portion connecting a first distal end of the first inclined portion to a second distal end of the second inclined portion.

5. The SIM card connector of claim 4, wherein the first inclined portion, second inclined portion, and the connection portion have the predetermined width.

6. The SIM card connector of claim 5, wherein the first inclined portion and the second inclined portion of the elastic support form a predetermined angle relative to the lower surface support, and the first distal end and second distal end rise to a height equal to or lower than the predetermined height of the side surface support when the elastic support is not tensioned.

7. The SIM card connector of claim 5, wherein a sum of a first width of the first inclined portion and a second width of the second inclined portion is corresponds to a difference in width between a first SIM card and a second SIM card of different sizes, the SIM card connector adapted to receive both the first SIM card and second SIM card.

8. The SIM card connector of claim 7, wherein the first SIM card is smaller than the second SIM card, and the first inclined portion, the second inclined portion and the connection portion are adapted to circumferentially support the first SIM card when it is inserted through the open area into the SIM card connector.

9. The SIM card connector of claim 8, wherein the connection portion further comprises a groove adapted to enable ejection of the first SIM card when fully inserted into the SIM card connector.

10. The SIM card connector of claim 8, wherein the widths of the first inclined portion, the second inclined portion and the connection portion are adapted to enable an electrical circuit formed in the first SIM card to couple with an electrical contact point disposed within the lower surface support.

11. The SIM card connector of claim 8, wherein a width of the open area corresponds to a width of the second SIM card, and the first inclined portion and the second inclined portion are adapted to be pressed towards the lower surface support by the inserting of the second SIM card through the open area.

12. The SIM card connector of claim 11, wherein the elastic support is adapted to be flush with a surface of the lower surface support when the second SIM card is completely inserted into the SIM card connector.

13. The SIM card connector of claim 12, wherein an electrical circuit formed in the second SIM card is adapted to couple to an electrical contact point disposed in the lower surface support when the second SIM card is completely inserted into SIM card connector.

14. The SIM card connector of claim 1, wherein the elastic support comprises a leaf spring.

15. An electronic device, comprising:
a Printed Circuit Board (PCB); and
a Subscriber Identity Module Card (SIM card) connector mounted in the PCB,
wherein the SIM card connector comprises:
a lower surface support having an open area adapted to receive a SIM card and a contact area adapted to be electrically coupled to the SIM card;
an elastic support disposed near at least one side surface of the open area and formed along a circumference of the lower surface support except for the open area, the elastic support having a predetermined width and an elasticity expressed towards an upper surface support of the SIM card connector; and
a side surface support having a predetermined height disposed circumferentially at distal edges of the lower surface support except for the open area,
wherein the upper surface support is coupled to the side surface support and includes a top surface formed parallel to the lower surface support adapted to partially enclose an upper portion of the SIM card.

16. The electronic device of claim 15, wherein the elastic support comprises:
a first inclined portion having one end coupled to and extending from the at least one side surface of the open area of the lower surface support and having the elasticity;
a second inclined portion having a second end coupled to and extending from another side surface of the at least one side surface of the open area and having the elasticity; and
a connection portion connecting a first distal end of the first inclined portion to a second distal end of the second inclined portion.

17. The electronic device of claim 16, wherein the first inclined portion, second inclined portion and the connection portion all have a same width and are formed as a single structure with the lower surface support, and
a sum of the widths of the first inclined portion and the second inclined portion corresponds to a difference between the widths of a first SIM card and a second SIM card insertable into the SIM card connector, the first SIM card smaller than the second SIM card.

18. The electronic device of claim 17, wherein the first inclined portion and the second inclined portion and the connection portion are adapted to circumferentially support the first SIM card inserted through the open area into the SIM card connector.

19. The electronic device of claim 18, wherein the widths of the first inclined portion, the second inclined portion and the connection portion are adapted to enable an electrical circuit formed in the first SIM card to couple with an electrical contact point disposed within the lower surface support, when the first SIM card is inserted into the SIM card connector.

20. The electronic device of claim 18, wherein a width of the open area corresponds to a width of the second SIM card, and the first inclined portion and the second inclined portion of the elastic support are adapted to be flush with a surface of the lower surface support by the second SIM card when inserted into the SIM card connector.

* * * * *